United States Patent [19]

Sanada

[11] Patent Number: 5,463,585
[45] Date of Patent: Oct. 31, 1995

[54] SEMICONDUCTOR DEVICE INCORPORATING VOLTAGE REDUCTION CIRCUIT THEREIN

[75] Inventor: Kohji Sanada, Tokyo, Japan

[73] Assignee: NEC Corporation, Tokyo, Japan

[21] Appl. No.: 227,796

[22] Filed: Apr. 14, 1994

[30] Foreign Application Priority Data

Apr. 14, 1993 [JP] Japan .................................. 5-112206

[51] Int. Cl.[6] .................................................. G11C 29/00
[52] U.S. Cl. ........................ 365/201; 365/226; 365/227; 365/154; 365/156; 371/21.1
[58] Field of Search ................................... 365/201, 226, 365/227, 154, 156; 371/21.1, 21.4

[56] References Cited

U.S. PATENT DOCUMENTS 5,132,929  7/1992  Ochii .................................... 365/201

Primary Examiner—David C. Nelms
Assistant Examiner—Huan Hoang

[57] ABSTRACT

A semiconductor device is disclosed which includes a storage area such as a RAM, a register, a latch, or a flip-flop. This device further includes a test mode detection circuit for detecting a test mode and a voltage control circuit for generating a power-down voltage that is lower than a power supply voltage supplied to the device, the power-down voltage being supplied to the storage area to test a data-hold characteristic thereof in the test mode. The power supply voltage is thereby free from being changed.

7 Claims, 6 Drawing Sheets

SEMICONDUCTOR DEVICE INCORPORATING VOLTAGE REDUCTION CIRCUIT THEREIN

BACKGROUND OF THE INVENTION

The present invention relates to a semiconductor device and, more particularly, to a semiconductor device having a storage area such as a random-access-memory (RAM), a register, a latch, or a flip-flop (F/F), which is required to test a data-hold characteristic thereof.

A storage area incorporated in a semiconductor device is often required to retain data stored therein even when a power supply voltage supplied thereto is lowered from a typical value. It is therefore necessary to test a data-hold characteristic of the storage area, i.e., to test whether or not the storage area retains the data stored therein during a power down mode in which a power voltage lower than its typical value is being supplied to the device. In particular, the data-hold characteristic is an important factor for a static random-access-memory (SRAM).

In testing the data-hold characteristic of the SRAM, test data are first written therein under the power supply voltage having a typical value (4.5–5.5 V). The SRAM is then brought into a data-hold mode by reducing the power voltage to a power-down voltage, 2 V for example, with keeping a chip-select (CS) signal taking an inactive high level for a predetermined time period. The power voltage is thereafter returned to the typical value and the SRAM is brought into a data read mode by applying the CS signal of the active low level to read out data therefrom. The data thus read out are compared with the expected data. The test for the data-hold characteristic is thus completed.

Referring to FIG. 9, there is shown a relationship between the power supply voltage and the CS signal for the SRAM as described above. The power supply voltage Vcc is indicated by a line 80, and the CS signal is indicated by a line 81. As described hereinbefore, the CS signal is maintained at the high level during a data-hold period and is changed to the active low level during periods other than the data-hold period to bring the SRAM into a data write mode or a data read mode. In FIG. 9, further, $t_{CDR}$ is defined as a chip-select set time which represents a time period from a time point at which the chip select signal CS is changed to the high level to a time point at which the power supply voltage Vcc is reduced to the minimum level of the typical power supply voltage. This time period is generally stipulated to be 0 ms in specifications of the data-hold test. On the other hand, $t_R$ is defined as a chip-select hold time which represents a time period from a time point at which the power supply voltage Vcc is returned to reach the level of 4.5 V to a time point at which the chip-select signal CS is changed to the low level. This period is generally stipulated to be 5 ms in the specifications of the data-hold test.

In an actual test, only one SRAM is not tested, but a number of SRAMs are coupled in parallel and tested at a time, as well known in the art. For this reason, test equipment is subjected to drive a very large capacitive load. Moreover, a decoupling capacitor having a large capacitance (for example, 1 μF) is coupled to a power supply line to stabilize the power supply voltage. As a result, it takes a relatively long time period to reduce the power supply voltage to the power-down level or to return it to the typical level. The test time is thus prolonged accordingly.

Furthermore, in the case where each memory cell of the SRAM is of a type having a load resistor of resistance of the order of several teraohms, the change in the actual power voltage applied to the memory cell is further lowered. For this reason, a certain memory cell is allowed to retrieve from the incorrect data storing condition even if it has a degraded drive capability. Such a defect memory cell is not detected consequently.

SUMMARY OF THE INVENTION

It is therefore an object of the present invention to provide an improved semiconductor device having a storage area. It is another object of the present invention to provide a semiconductor device in which a data-hold test for a storage area incorporated therein is carried out for a short time with an accurate test resultant.

A semiconductor device according to this invention includes a storage area to be tested, a power voltage reduction circuit coupled to a power terminal supplied with a power voltage and generating a reduced voltage smaller than the power voltage, and a voltage supply circuit supplying the storage area with the power voltage in a normal operation mode and with the reduced voltage in a test mode.

Thus, the voltage actually applied to the storage area is reduced within the device. Accordingly, test equipment is free from controlling the power voltage to be supplied to the device. The data-hold test is thus carried out at a high speed.

BRIEF DESCRIPTION OF THE DRAWINGS

The above and other objects, features and advantages of the present invention will become more apparent by reference to the following detailed description taken in conjunction with the accompanying drawings, wherein.

DETAILED DESCRIPTION OF THE PREFERRED EMBODIMENTS

Figure 1:
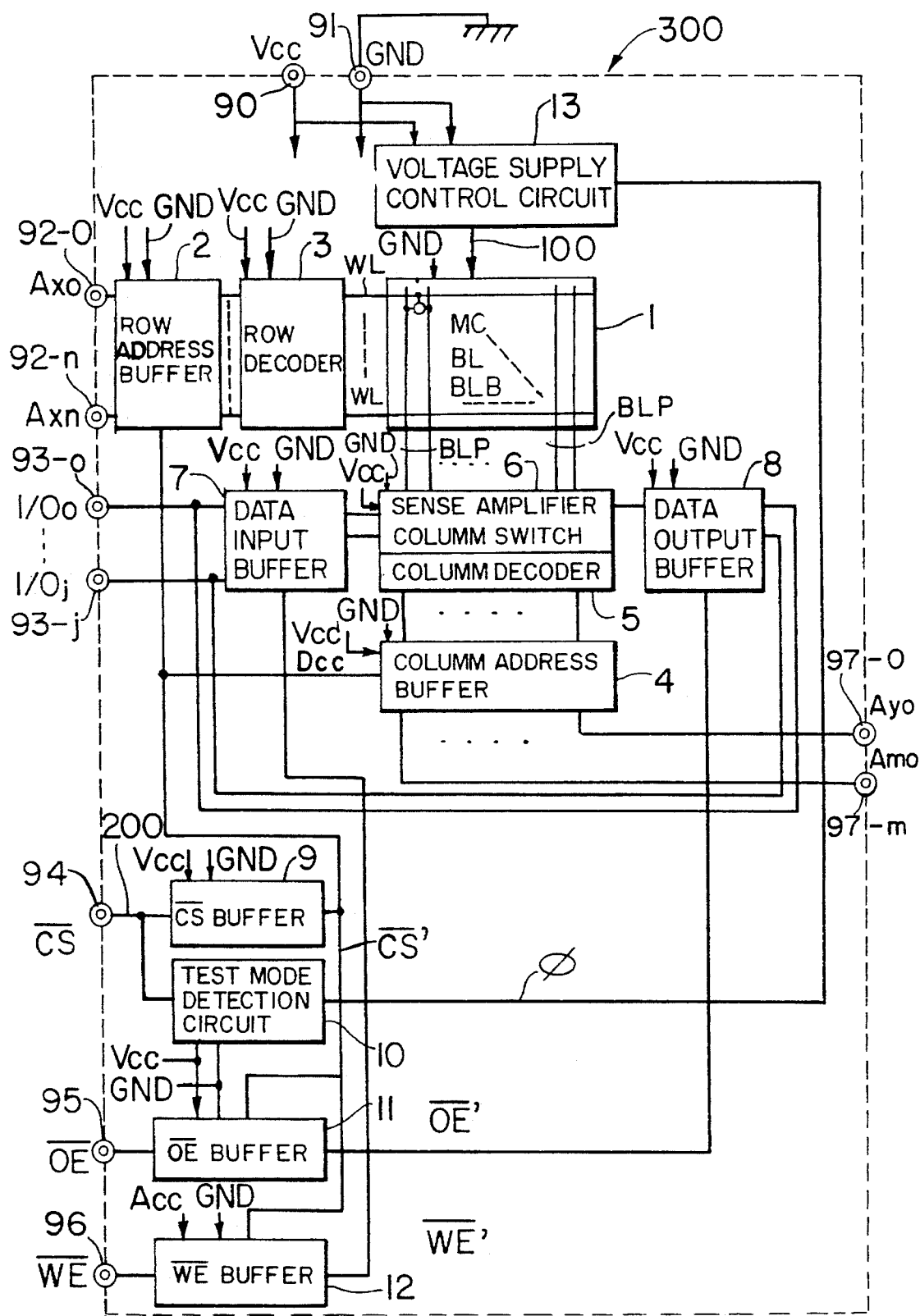
FIG. 1 is a block diagram illustrative of an SRAM as a semiconductor device according to one embodiment of the invention.

Referring to FIG. 1, there is shown an SRAM 300 as a semiconductor device according to an embodiment of this invention. This SRAM 300 is fabricated as a semiconductor integrated circuit device and has a power terminal 90 applied with a power supply voltage Vcc and a grounding terminal 91 applied with a ground voltage GND. These voltages are supplied to various internal circuits of the SRAM 300 as shown in the drawing. However, a memory cell array 1 is not supplied directly with the power voltage Vcc, but with a voltage through a voltage line 100 which will be described in detail later. The memory cell array 1 includes a plurality of word lines WL, a plurality of bit line pairs BLP each having true and complementary bit lines BL and BLB, and a number of SRAM cells MC (only one cell being shown in the figure) disposed at each intersection of the word line WL and the bit line pair BLP.

Figure 2:
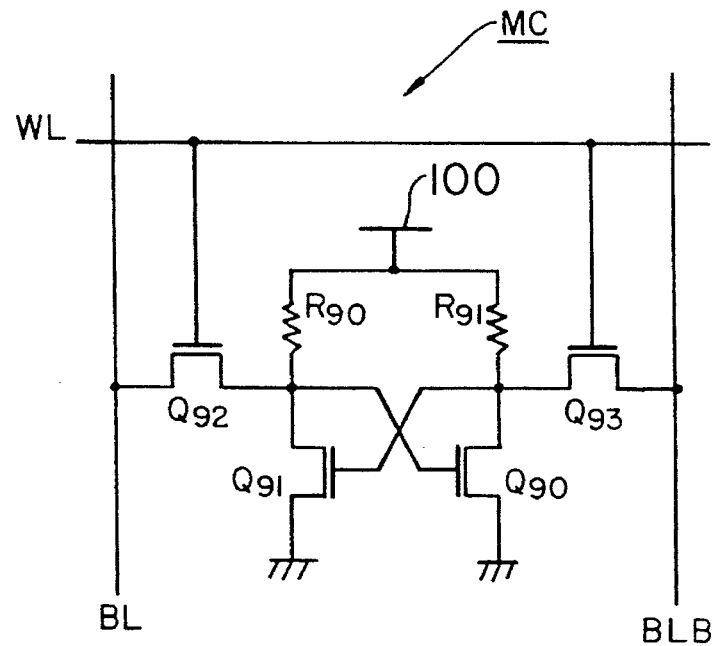
FIG. 2 is an equivalent circuit diagram indicative of a memory cell shown in FIG. 1.

Turning to FIG. 2, each memory cell MC consists of four N-channel MOS transistors $Q_{90}$ to $Q_{93}$ and two load resistors $R_{90}$ and $R_{91}$ which are connected as shown. It should be noted that the voltage line 100 serves as a power supply line for each memory cell MC.

Referring back to FIG. 1, row address signals $A_{x0}$ to $A_{xn}$ are supplied respectively to address terminals 92-0 to 92-n, and in response thereto an address buffer 2 and a row decoder 3 select one of word lines WL. On the other hand, column address signals $A_{y0}$ to $A_{ym}$ supplied to address terminals 97-0 to 97-m causes an address buffer 4 and a column decoder 5 to generate selection signals for a predetermined number of bit line pairs BLP. In response to these selection signals, a sense amplifier/column switch 6 selects the corresponding bit line pairs and performs a data amplification operation. Thus, the memory cells designated by the address signals are selected.

When an output-enable signal OE supplied to a terminal 95 is at an active low level, at this time, an activate internal output control signal OE' is output from an output enable buffer 11 to activate a data output buffer 8. Data read out from the selected memory cells MC are thus output at data input/output terminal 93-0 to 93-j. On the other hand, when the signal OE is at the inactive high level and a write enable signal WE is at an active low level, an activate internal write enable control signal WE' is output from a write enable buffer 12. Accordingly, a data input buffer 7 is activated, and write data supplied to the input/output terminals I/O0 to I/Oj are written into the selected memory cells. The above data read and write operations are performed under the control of a chip-select buffer 9. That is, when a chip-select signal CS supplied to the terminal 94 takes the active low level, the chip select buffer 9 produce an activate internal chip select signal CS' to activate the address buffer 2, the output enable buffer 11 and the write enable buffer 12.

The present SRAM 300 further includes additional circuits in accordance with the present invention. The additional circuits comprises a test mode detection circuit 10 and a voltage supply control circuit 13. With these circuits 10 and 13, the voltage supplied to the memory cell array 1 through the line 100 is reduced internally, down to a predetermined level without changing the power supply voltage Vcc applied to the terminal 90. More specifically, when a test mode signal having a level higher than the power voltage Vcc is applied to the chip select terminal 94, the test mode detection circuit 10 detects that signal and brings its output signal to the active high level. In response thereto, the voltage supply control circuit 13 supplies the power-down voltage to the power supply line 100 of the memory cell array 1. During the normal operation mode, on the other hand, the signal is held at the inactive low level, so that the power supply voltage Vcc is transferred to the power supply line 100 is supplied from the circuit 13.

The test mode signal applied to the terminal 94 takes in the present embodiment the level of Vcc+1.3 V (designated as the high level in the test mode) to bring the SRAM 300 into the test mode. On the other hand, the terminal 94 is supplied with the chip-select signal CS' which assumes 0.8 V as the active low level VIL and 2.2 V as the inactive high level VIH in this embodiment.

Figure 3:
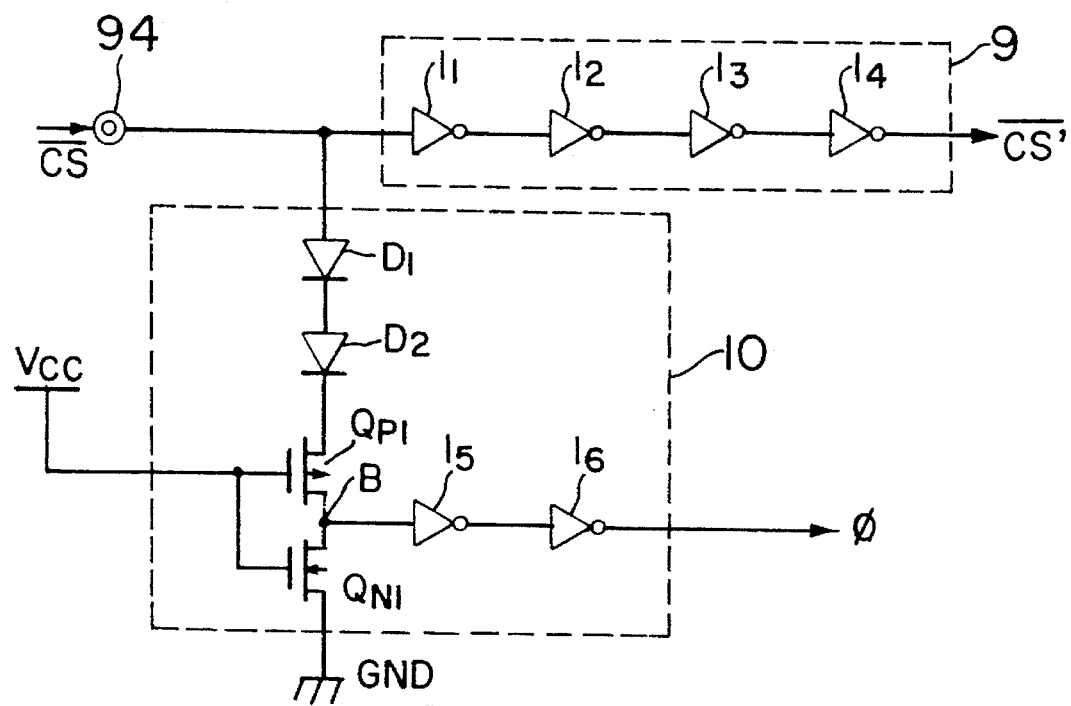
FIG. 3 is a circuit diagram indicative of a chip-select (CS) buffer and a test mode detection circuit shown in FIG. 1.

Referring to FIG. 3, the CS' signal is converted to the internal chip select signal CS via four stages of inverters $I_1$ to $I_4$ constituting the chip select buffer 9, and is also supplied to the serially connected circuit of a P-channel MOS transistor $Q_{P1}$ and an N-channel MOS transistor $Q_{N1}$ via a series circuit of diodes $D_1$ and $D_2$. The gates of transistors $Q_{P1}$ and $Q_{N1}$ are supplied with the power supply voltage Vcc (5 V in this embodiment), and the output voltage of the node B of the transistors $Q_{P1}$ and $Q_{N1}$ is led out via inverters 15 and 16 as the internal test mode signal. Accordingly, the signal takes the low level during the normal operation mode and the high level during the test mode.

Figure 4:
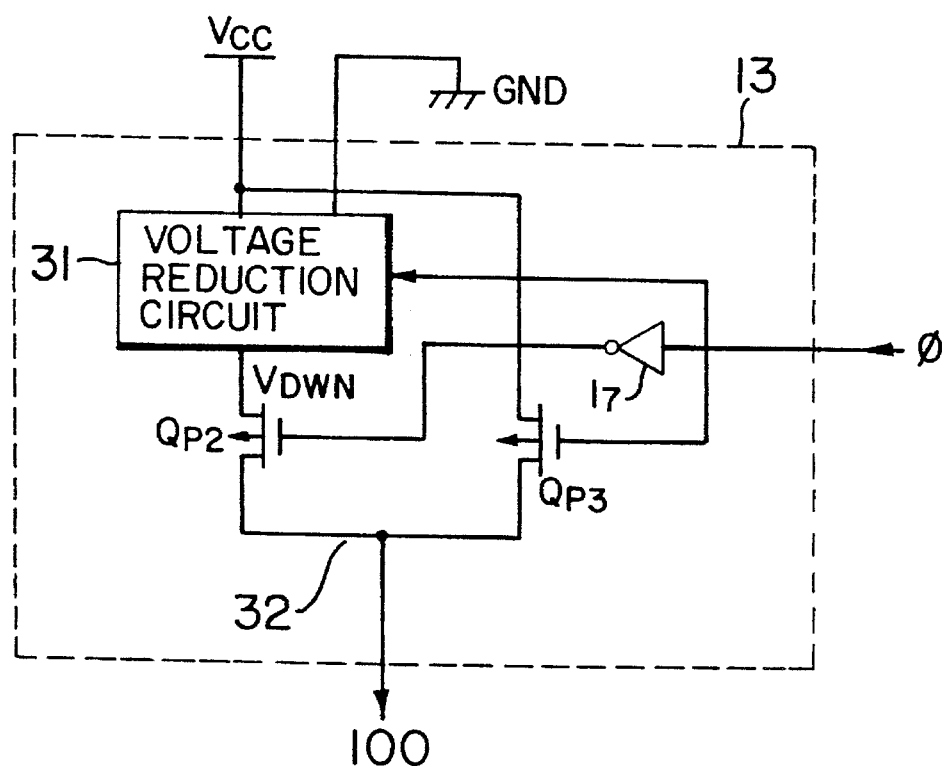
FIG. 4 is a circuit diagram indicative of a voltage supply control circuit shown in FIG. 1.

Turning to FIG. 4, the voltage supply control circuit 13 includes a voltage reduction circuit 31 which reduces the power supply voltage Vcc to the power-down level (2 V in this embodiment) to output a power-down voltage $V_{DWN}$. The circuit 13 further has a selector 32 which alternatively supplies the power-down voltage $V_{DWN}$ (2 V) or the power supply voltage Vcc (5 V) to the power supply line 100 of the memory cell array 1. This selector 32 has P-channel MOS transistors $Q_{P2}$ and $Q_{P3}$ and an inverter $I_7$ which are connected as shown. Accordingly, when the signal ø takes the low level to represent the normal mode, the transistor $Q_{P3}$ is turned ON. When the signal ø assumes the high level to indicate the test mode, on the other hand, the transistor $Q_{P2}$ is turned ON.

Figure 5:
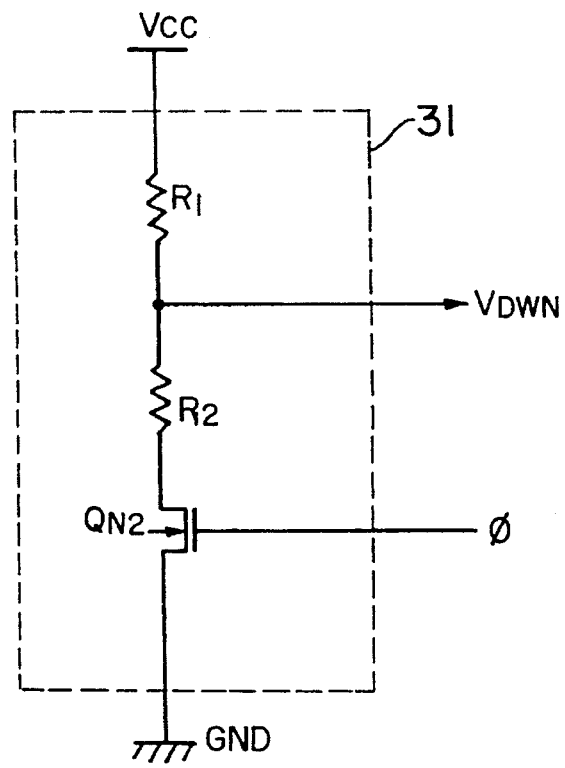
FIG. 5 is a circuit diagram indicative of a voltage reduction circuit shown in FIG. 3.

As shown in FIG. 5, the voltage reduction circuit 31 includes resistors $R_1$, $R_2$ and an N-channel MOS transistor $Q_{N2}$ connected in series between the power supply voltage Vcc and the grounding voltage GND. The N-channel MOS transistor $Q_{N2}$ is supplied at it gate with the signal ø. Accordingly, the transistor $Q_{N2}$ is turned ON in the test mode. The power-down voltage $V_{DWN}$ is thus generated from the node of the resistors $R_1$ and $R_2$. During the normal operation mode the signal ø is at the low level, so that the transistor $Q_{N2}$ is made non-conductive. No power is thus consumed in this circuit 31. If desired, the transistor $Q_{N2}$ can be deleted. In this case, however, the power consumption will be increased more or less.

Figure 6:
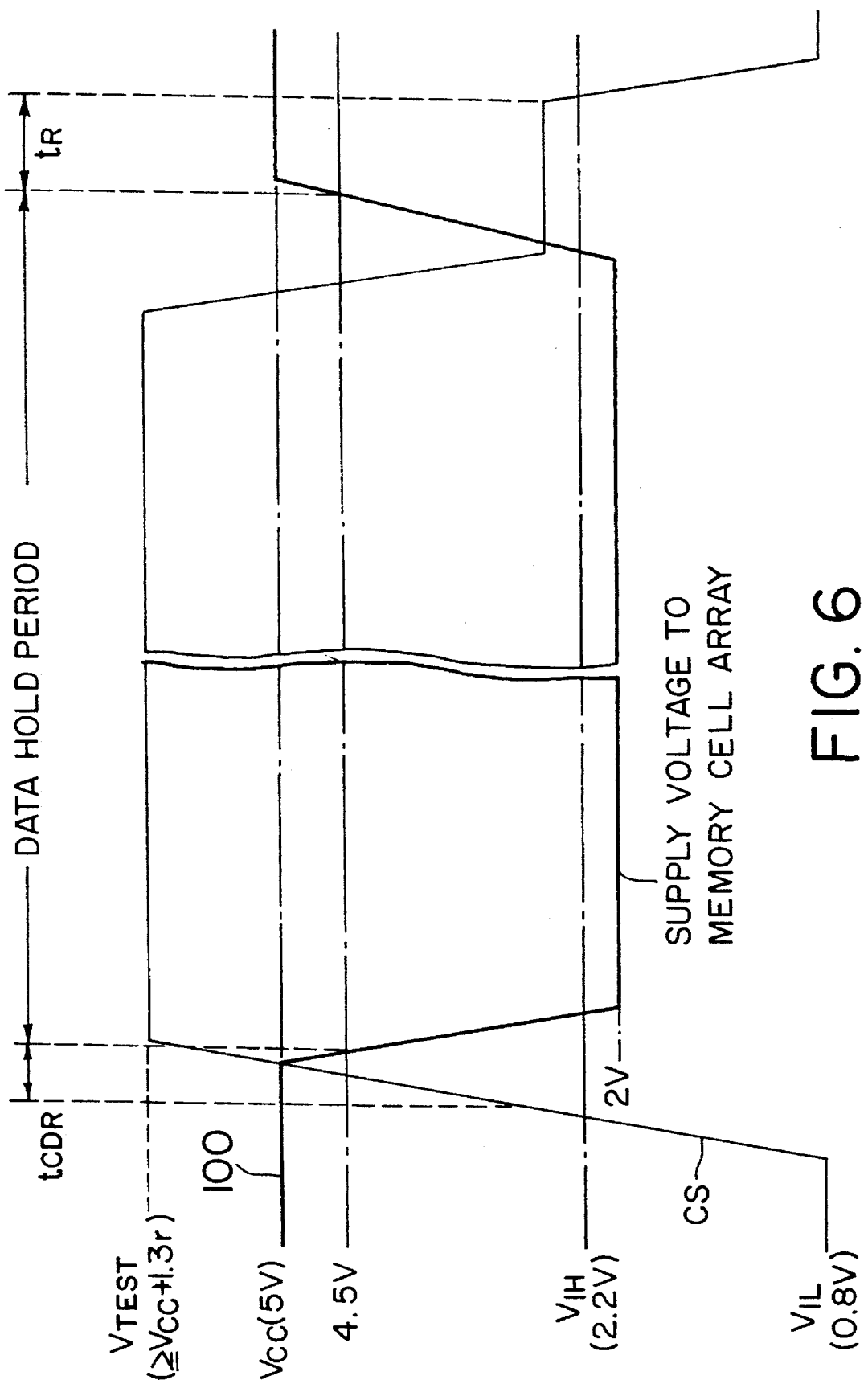
FIG. 6 is a timing chart for explaining a data hold test for the memory shown in FIG. 1.

Description will be now made on a test of the data-hold characteristic of the SRAM 300 with reference also to FIG. 6. The SRAM 300 is first brought into a data-write mode by applying the chip select signal CS' having the active low level VIL. Test data are then written into all the memory cells of the memory cell array 1 in the manner as described in the above. At this time, the signal ø is at the low level to turn the transistor $Q_{P3}$ (FIG. 4) ON. Accordingly, the power supply line 100 of the memory cell array 1 is supplied with the power voltage Vcc. The terminal 94 is thereafter supplied with the test mode signal having the test high level $V_{TEST}$ as shown in FIG. 6. In response thereto, the signal ø is changed to the high level. Specifically, the chip select signal CS is changed to the test voltage $V_{TEST}$ which is higher than Vcc+2 Vf (Vf being the forward voltage of the diodes $D_1$ and $D_2$)+$V_{Tp}$ (threshold of the P-channel MOS transistor $Q_{P1}$), as described in connection with FIG. 3. In this embodiment, it is designed that Vf=0.3 V, $V_{Tp}$=0.7 V and Vcc=5 V. Therefore, the high level $V_{TEST}$ of the chip select signal for initiating the test mode takes the level higher than 5 V+0.6V+0.7 V=6.3 V. As a result, the voltage of the node B goes to the high level and the step-down control signal goes to the active high level. As a result, the power-down voltage $V_{DWN}$ is generated and the transistor $Q_{P2}$ (FIG. 4) is turned on to supply the voltage $V_{DWN}$ to each memory cell MC through the power supply line 100 of the memory cell array 1. This condition is held for a predetermined period of time.

Thereafter, the chip-select signal CS is returned to the high level of the normal operation and is subsequently inverted to the active low level. The data SRAM 300 is thus brought into a data-read mode. In this mode, the data stored in each memory cell is read out therefrom and then compared with the expected value in the test device, thus completing the data hold test.

Figure 9:
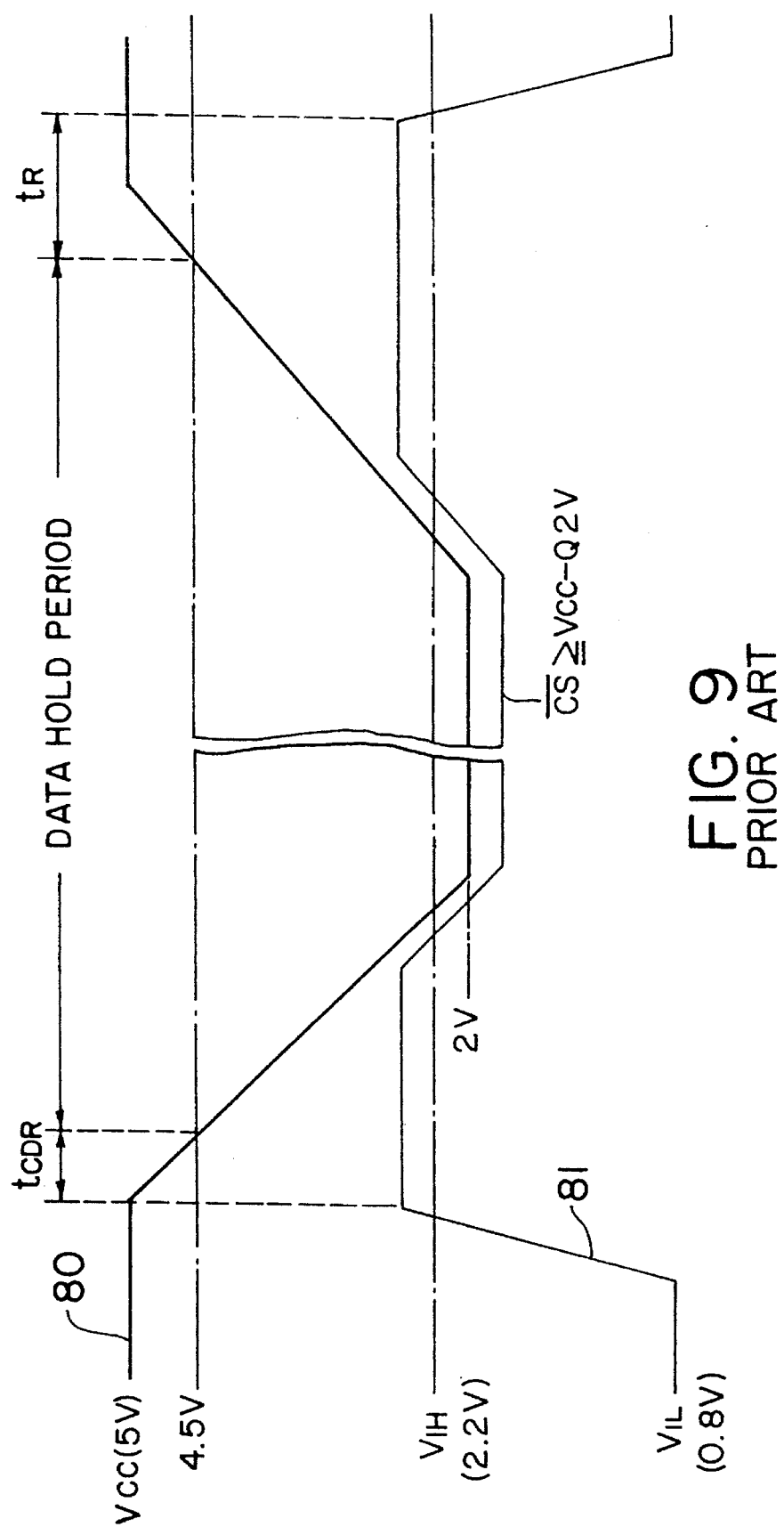
FIG. 9 is a timing chart for explaining a data-hold test according to prior art.

As described in the above, the data-hold test is executed without changing the power supply voltage Vcc. On the other hand, the voltage change of the power supply line 100 of the memory cell array 1 is extremely rapid as is apparent from a comparison between FIG. 6 with FIG. 9. Moreover, since the change in power voltage is applied only to the power supply line 100 of the memory cell array 1 and the power supply voltage Vcc is maintained to be applied to other circuits, no additional load is connected to the circuit 13. The change in voltage from 5 V to 2 V or from 2 V to 5 V of the power supply voltage line 100 can be accomplished fast.

Figure 7:
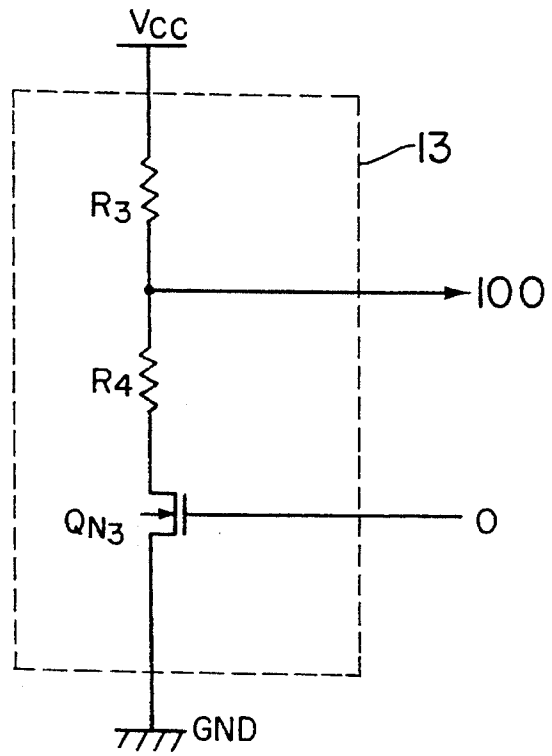
FIG. 7 is a circuit diagram representative of another example of the voltage supply control circuit shown in FIG. 1.

The voltage supply control circuit 13 can be constructed by a circuit shown in FIG. 7, which has only resistors $R_3$ and $R_4$ and an N-channel MOS transistor $Q_{N3}$ connected in series between the power supply voltage Vcc and the grounding voltage GND. The node of the resistors $R_3$ and $R_4$ is connected to the power supply line 100 of the memory cell array 1, and the signal ø is supplied to the gate of the transistor $Q_{N3}$. In the normal mode, the transistor $Q_{N3}$ is turned off by the low level signal ø, and hence the voltage line 100 of the memory cell array 1 transfers the power supply voltage Vcc. On the other hand, when the control signal ø goes to the high level in the test mode, the transistor $Q_{N3}$ is turned on, so that the voltage 100 receives the power-down level derived by the resistance-dividing circuit by the resistors $R_3$ and $R_4$.

Figure 8:
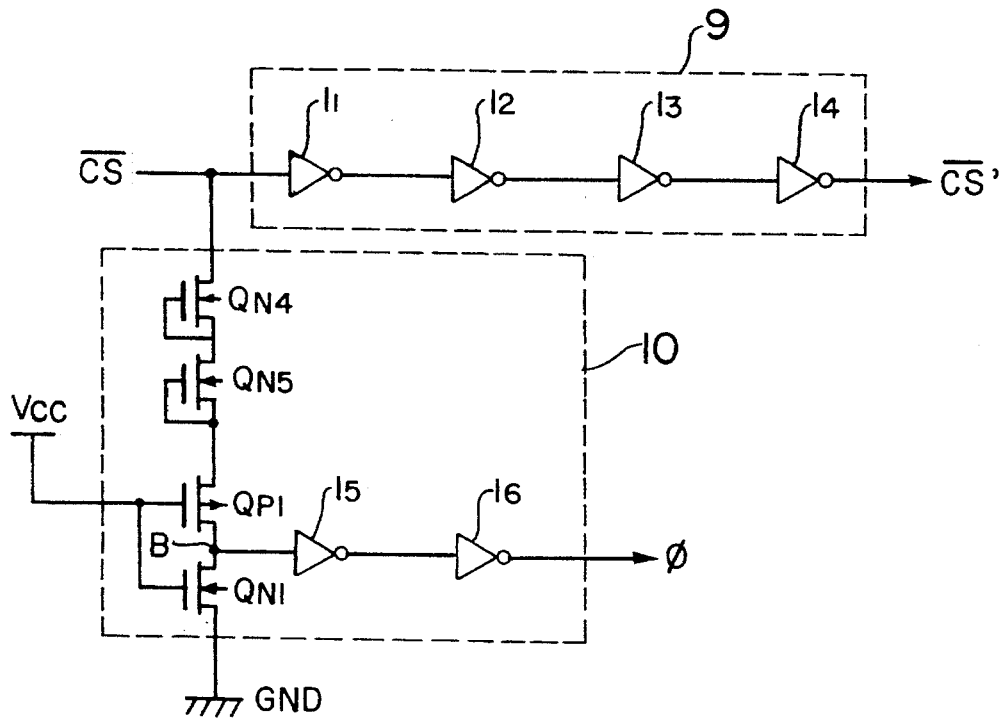
FIG. 8 is a circuit diagram representative of another example of the chip-select buffer and the test mode detection circuit shown in FIG. 1.

The test mode detection circuit 10 can be modified as shown FIG. 8, in which the same constituents as those shown in FIG. 3 are denoted by the same reference symbols. This example is constituted by replacing the diodes $D_1$ and $D_2$ of FIG. 3 by N-channel MOS transistors $Q_{N4}$ and $Q_{N5}$.

Although four stages of inverters $I_1$ to $I_4$ are employed in FIGS. 3 and 8 in order to obtain the internal chip select signal CS', the number of stages can be selected in accordance with the characteristics of the internal chip select signal. The same thing applies to the number of stages of the inverters $I_5$ and $I_6$ for obtaining the step-down control signal ø. However, it is necessary for both cases to choose an even number of stages, and that the operating power supply voltage of these inverters be Vcc=5 V.

Moreover, in the above embodiments the step-down control signal ø is obtained by using the chip select signal. However, it is of course possible to obtain the step-down control signal by using a control signal for controlling the operating conditions of the memory, such as an output enable signal (inverted OE) or a write enable signal (inverted WE). Further, this invention can be applied to other semiconductor devices having a storage area for which the data hold test is required.

As described in the above, according to this invention it is possible to carry out the data hold test of the memory by providing within the semiconductor device a step-down circuit which accomplishes step-down of the power supply voltage and controlling the step-down circuit by means of an external control signal terminal. Therefore, this invention can drastically cut down the transition time of the power supply voltage, and it has an effect of accomplishing the data hold test according almost perfectly to the specifications even in the case of a plurality of parallel processings.

Although the invention has been described with reference to specific embodiments, this description is not meant to be construed in a limiting sense. Various modifications of the disclosed embodiments, as well as other embodiments of the invention, will become apparent to one skilled in the art upon reference to the description of the invention. It is therefore contemplated that the appended claims will cover any modifications or embodiments as fall within the true scope of the invention.

What is claimed is:

1. A semiconductor device comprising storage means having a data input/output node and a power node provided independently of said data input/output node, said storage means inputting and operating on a voltage supplied to said power node, storing data transferred thereto through said data input/output node and outputting data stored therein to said data input/output node, a power terminal supplied with a power supply voltage, means coupled to said power terminal for generating a power-down voltage smaller than said power supply voltage, and means for supplying said power node of said storage means with said power-down voltage in a test mode and with said power supply voltage in a normal operation mode.

2. The semiconductor device as claimed in claim 1; and further comprising a data line, a switch means connected between said data input/output node and said data line, and a selection signal generating means for generating a selection signal, said selection signal generating means being connected to said switch means, said switch means connecting said data input/output node and said data line in response to said selection signal from said selection signal generating means.

3. A semiconductor device comprising plurality of word lines; a plurality of bit lines; a power line; a plurality of memory cells each disposed at a different one of intersections of said word lines and said bit lines and being connected to said power line; a data read/write control circuit for selecting one of said word lines and one of said bit lines to designate at least one of said the memory cells in response to address signals and performing a data read/write operation on said at least one of said memory; a power terminal receiving a power supply voltage; and a voltage supply control circuit connected to said power terminal and said power line to supply said power supply line with said power supply voltage during a normal operation mode and with a power-down voltage smaller than said power supply voltage during a test mode.

4. The semiconductor device as claimed in claim 3, wherein said voltage supply control circuit further supplies said data read/write control circuit with said power supply voltage during both of said normal operation mode and said test mode.

5. A semiconductor device comprising a storage area, a control circuit for performing a data read/write operation to read and write data from and into said storage area, a power terminal receiving a power supply voltage, means coupled to said power terminal for generating a power-down voltage smaller than said power supply voltage at said power terminal independently of a current flowing through said storage area, and voltage supply means for supplying said power supply voltage to both of said storage area and said control circuit during a normal operation mode and supplying said power supply voltage and said power-down voltage to said control circuit and said storage area, respectively, during a test mode.

6. The semiconductor device as claimed in claim 2, wherein said means coupled to said power terminal include first and second power nodes supplied with first and second voltage, respectively, a third power node coupled to said storage area, and a control node supplied with a control signal, and further include first means for supplying said third power node with said first voltage at said first power node when said control signal takes a first logic level, and second means for supplying said third power node with said second voltage at said second power node when said control signal takes a second logic level different from said first logic level.

7. The semiconductor device as claimed in claim 6, wherein said control signal is supplied from said control circuit.

* * * * *